(12) United States Patent
Nazarian et al.

(10) Patent No.: US 8,274,812 B2
(45) Date of Patent: Sep. 25, 2012

(54) WRITE AND ERASE SCHEME FOR RESISTIVE MEMORY DEVICE

(75) Inventors: Hagop Nazarian, San Jose, CA (US); Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 203 days.

(21) Appl. No.: 12/815,369

(22) Filed: Jun. 14, 2010

(65) Prior Publication Data

US 2011/0305066 A1    Dec. 15, 2011

(51) Int. Cl.
*G11C 11/00* (2006.01)
(52) U.S. Cl. ............... 365/148; 365/149; 365/189.09
(58) Field of Classification Search .......... 365/148, 365/149, 189.09, 189.06, 189.07, 202, 203, 365/189.05, 185.05, 185.16, 185.17, 185.28, 365/185.29, 72
See application file for complete search history.

(56) References Cited

U.S. PATENT DOCUMENTS

| | | | | |
|---|---|---|---|---|
| 5,627,451 | A * | 5/1997 | Takeda | 320/151 |
| 7,667,442 | B2 * | 2/2010 | Itoh | 323/276 |
| 7,704,788 | B2 | 4/2010 | Youn et al. | |
| 7,830,698 | B2 | 11/2010 | Chen et al. | |
| 2007/0069119 | A1 | 3/2007 | Appleyard et al. | |
| 2007/0171698 | A1 | 7/2007 | Hoenigschmid et al. | |
| 2008/0019163 | A1 | 1/2008 | Hoenigschmid et al. | |
| 2008/0165571 | A1 | 7/2008 | Lung | |
| 2008/0278988 | A1 | 11/2008 | Ufert | |
| 2009/0014707 | A1 | 1/2009 | Lu et al. | |
| 2009/0321706 | A1 | 12/2009 | Happ et al. | |
| 2010/0237314 | A1 | 9/2010 | Tsukamoto et al. | |
| 2010/0277969 | A1 | 11/2010 | Li et al. | |
| 2011/0310656 | A1 | 12/2011 | Kreupl et al. | |

OTHER PUBLICATIONS

International Search Report for PCT/US2011/040362 filed on Jun. 14, 2011.
Written Opinion for PCT/US2011/040362 filed on Jun. 14, 2011.
Office Action for U.S. Appl. No. 12/834,610 dated Apr. 16, 2012.
R C Newman, "Defects in silicon", Rep. Prog. Phys., 1982, pp. 1163-1210, vol. 45, The Institute of Physics, Great Britain.
Office Action for U.S. Appl. No. 13/149,757 dated Jun. 19, 2012.

* cited by examiner

*Primary Examiner* — Dang Nguyen
(74) *Attorney, Agent, or Firm* — Ogawa P.C.

(57) ABSTRACT

A method for programming a two terminal resistive memory device, the method includes applying a bias voltage to a first electrode of a resistive memory cell of the device; measuring a current flowing through the cell; and stopping the applying of the bias voltage if the measured current is equal to or greater than a predetermined value.

25 Claims, 7 Drawing Sheets

WRITE AND ERASE SCHEME FOR RESISTIVE MEMORY DEVICE

CROSS-REFERENCES TO RELATED APPLICATIONS

NOT APPLICABLE

BACKGROUND OF THE INVENTION

The present invention relates to a method and apparatus for programming and erasing a non-volatile memory device including a resistive memory cell.

Resistive random-access memories (RRAMs) have generated significant interest recently as a potential candidate for ultra-high density non-volatile information storage. A typical RRAM device has an insulator layer provided between a pair of electrodes and exhibits electrical pulse induced hysteretic resistance switching effects.

The resistance switching has been explained by the formation of conductive filaments inside the insulator due to Joule heating and electrochemical processes in binary oxides (e.g. NiO and $TiO_2$) or redox processes for ionic conductors including oxides, chalcogenides and polymers. The resistance switching has also been explained by field assisted diffusion of ions in $TiO_2$ and amorphous silicon (a-Si) films.

In the case of a-Si structures, electric field-induced diffusion of metal ions into the silicon leads to the formation of conductive filaments that reduce the resistance of the a-Si structure. These filaments remain after a biasing (or program) voltage is removed, thereby giving the device its non-volatile characteristic, and they can be removed by reverse flow of the ions back toward the metal electrode under the motive force of a reverse polarity applied voltage.

Resistive devices based on an a-Si structure, particularly that formed on polysilicon, typically exhibit good endurance or life cycle. However, the endurance of the resistive device can be shortened if excessive bias voltage is applied during the repeated write and erase cycles in part due to Joule heating and movements of an unnecessarily large number of metal ions in the a-Si structure. Furthermore, in general, RRAM device yield is affected by the electroforming process during which the major part of conducting path is formed inside the insulating switching layer by applying larger voltage (or current) signal to the device.

BRIEF SUMMARY OF THE INVENTION

The present invention relates to a non-volatile memory device, e.g., a resistive memory device, and, more particularly, to a method and apparatus for programming and erasing a resistive memory cell in the device by controlling a bias voltage (or current) to the memory cell based on the change in the current flowing through the memory cell.

In an embodiment, a method for programming a two terminal resistive memory device, the method includes applying a bias voltage (or bias current) to a first electrode of a resistive memory cell of the device; measuring a current flowing through the cell; and stopping the applying of the bias voltage if the measured current is equal to or greater than a predetermined value.

In another embodiment, a method of forming a conductor filament structure in a switching device includes providing a resistive switching device; applying a voltage to the switching device and measuring a current flowing in the switching device while the voltage is being applied to the device; increasing the voltage applied using a ramp rate; obtaining a voltage versus current plot while increasing the voltage, the plot comprising slopes; obtaining a threshold voltage for forming the conductor filament structure, the threshold voltage being at a voltage while the slope is changed to or becomes larger than the predefined value; and stop applying the voltage if the voltage is determined to be at about the threshold voltage, wherein the conductor filament structure is being formed in the switching element as the voltage is being applied to the switching device. The voltage is stopped after a certain time delay after the determination has been made that the voltage is at about the threshold voltage.

In another embodiment, a method of forming a conductor filament structure in a switching device includes providing a resistive switching device including a top electrode, a switching element, and a bottom electrode; applying a plurality of voltage pulses to the switching device and measuring a current flowing in the switching device while each voltage pulse is being applied to the device, the voltages of voltage pulses increasing over time; obtaining a rate of change in current as each voltage pulse is being applied, measuring a resistance value of the device if the rate of change in current is greater than or equal to the predetermined value; and initiating a termination process to stop applying the voltage pulses if the measured resistance value is lower than a predetermined resistance value. The conductor filament structure is being formed in the switching element as the voltage pulses are being applied to the switching device. In an implementation, the voltages in the voltage pulses are increased as a function of time in a linear manner. In another implementation, the voltages in the voltage pulses are increased as a function of time in a predefined manner. In yet another implementation, the termination process is completed and applying the voltage pulses is stopped a certain time delay after the termination process has been initiated.

In another embodiment, a method of forming a conductor filament structure in a switching device includes providing a resistive switching device including a top electrode, a switching element, and a bottom electrode; applying a predetermined voltage to the device for a predetermined period of time; and measuring a rate of change of current in the device as a function of time within the predetermined period of time; if the rate of change of current is greater than a predetermined value, initiating a termination process to stop applying the predetermined voltage, and if the rate of change of current is less than a predetermined value, continue applying the predetermined voltage. The conductor filament structure is being formed in the switching element as the predetermined voltage is being applied to the switching device.

In yet another embodiment, a method of forming a conductor filament structure in a switching device includes providing a resistive switching device including a top electrode, a switching element, and a bottom electrode; applying a predetermined current to the device for a predetermined period of time; measuring a rate of change of voltage across the device as a function of time within the predetermined period of time; if the rate of change of voltage dropped across the device is greater than a predetermined value, initiating a termination process to stop applying the predetermined current, and if the rate of change of voltage dropped across the device is less than a predetermined value, continue applying the predetermined current. The conductor filament structure is being formed in the switching element as the current is being applied to the switching device.

In yet another embodiment, a method of forming a conductor filament structure in a switching device includes providing a resistive switching device including a top electrode, a switching element, and a bottom electrode; applying a plurality of current pulses to the switching device and measuring a voltage across the switching device while each of the current pulse is being applied to the device; increasing the current in the current pulse over time; measuring a resistance value of the device if the rate of change in voltage is greater than the predetermined value; and initiating a termination process if the measured resistance value is lower than a predetermined resistance value. The conductor filament structure is being formed in the switching element as the current pulses are being applied to the switching device. In an implementation, the current in the current pulses is increased as a function of time in a linear manner. In another implementation, the current in the current pulses is increased as a function of time in a predefined manner. In another implementation, the termination process is completed a certain time delay after the termination process has been initiated.

The details of one or more embodiments are set forth in the accompanying drawings and the description below. Other features, objects, and advantages will be apparent from the description and drawings, and from the claims.

BRIEF DESCRIPTION OF THE DRAWINGS

Exemplary embodiments will hereinafter be described in conjunction with the appended drawings, wherein like designations denote like elements, and wherein.

DETAILED DESCRIPTION OF THE INVENTION

Figure 1:
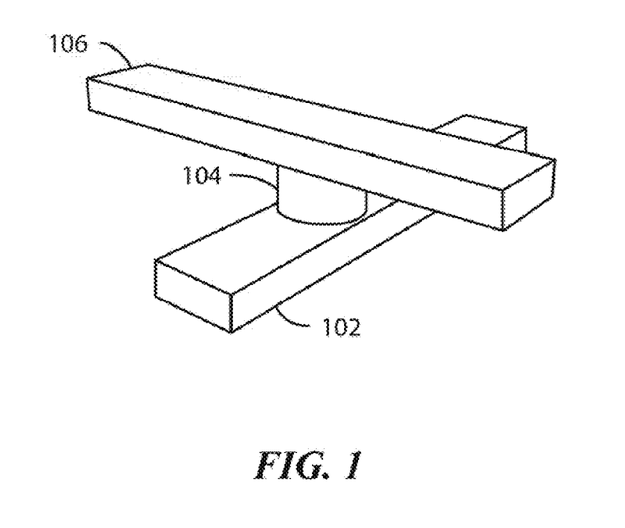
FIG. 1 illustrates a non-volatile memory device including a bottom electrode, a switching medium, and a top electrode according an embodiment of the present invention.

FIG. 1 illustrates a non-volatile memory device 100 including a bottom electrode 102, a switching medium 104, and a top electrode 106 according an embodiment of the present invention. The switching medium 104 exhibits a resistance that can be selectively set to various values, and reset, using appropriate control circuitry. The device 100 is a two-terminal resistive random-access memory (RRAM) in the present embodiment. As will be appreciated by one skilled in art, the device 100 may be used also as a programmable variable capacitor or other types of devices.

The RRAM is a two-terminal device having a switching medium provided between top and bottom electrodes. The resistance of the switching medium can be controlled by applying an electrical signal to the electrodes. The electrical signal may be current-based or voltage-based. As used herein, the term "RRAM" or "resistive memory device" refers to a memory device that uses a switching medium whose resistance can be controlled by applying electrical signal without ferroelectricity, magnetization and phase change of the switching medium.

In the present embodiment, the device 100 is amorphous-silicon-based RRAM and uses amorphous silicon (a-Si) as the switching medium 104. The resistance of the switching medium 104 changes according to formation or retrieval of a conductive filament inside the a-Si switching medium according to a voltage applied. The top electrode 106 is a conductive layer containing silver (Ag) and acts as the source of filament-forming ions in the a-Si structure. Although silver is used in the present embodiment, it will be understood that the top electrode 106 can be formed from various other suitable metals, such as gold (Au), nickel (Ni), aluminum (Al), chromium (Cr), iron (Fe), manganese (Mn), tungsten (W), vanadium (V), and cobalt (Co). The bottom electrode 102 is a boron-doped or other p-type polysilicon electrode that is in contact with a lower end face of the a-Si structure.

Figure 2:
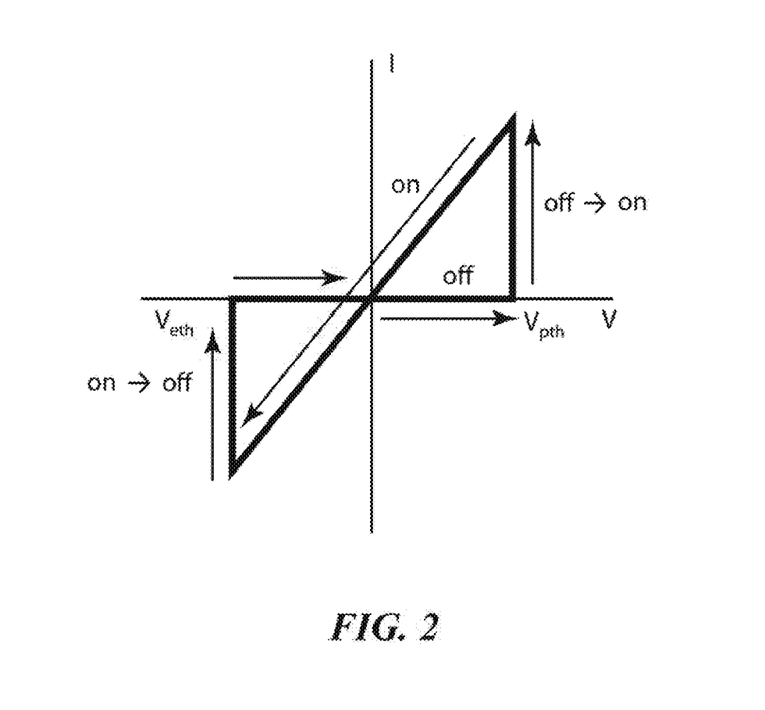
FIG. 2 illustrates resistance switching characteristics of the device according to an embodiment of the present invention.

FIG. 2 illustrates resistance switching characteristics of the device 100 according to an embodiment of the present invention. The switching medium 104 displays a bipolar switching mechanism. The resistance of the switching medium 104 changes depending on the polarity and magnitude of the current signal applied to the switching medium 104 via the top and bottom electrodes 106 and 102. The device 100 is changed into ON-state (low resistance state) when a positive voltage equal to or greater than a program threshold voltage (or program voltage) $V_{pth}$ is applied. In an embodiment, the program voltage ranges between 2 volts to 5 volts depending on the materials used for the switching medium 104 and the top electrode 106. The device 100 is switched back to OFF-state (high resistance state) when a negative voltage equal to or greater than an erase threshold voltage (or erase voltage) $V_{eth}$ is applied. In an embodiment, the erase voltage ranges from −2 volts to −5 volts. The device state is not affected if the voltage applied is between two threshold voltages $V_{pth}$ and $V_{eth}$, which enables a low-voltage read process. Once the device 100 is set to a specific resistance state, the device 100 retains the information for a certain period (or retention time) without electrical power.

Figure 3A:
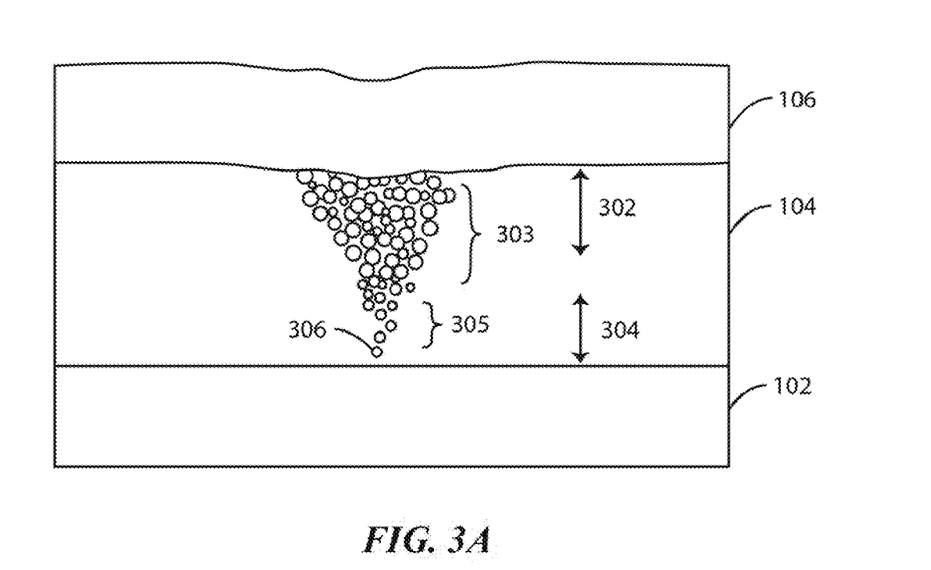
FIG. 3A illustrates a two-terminal device that is placed in an ON state by applying a program voltage $V_{pth}$ to the top electrode.
Figure 3B:
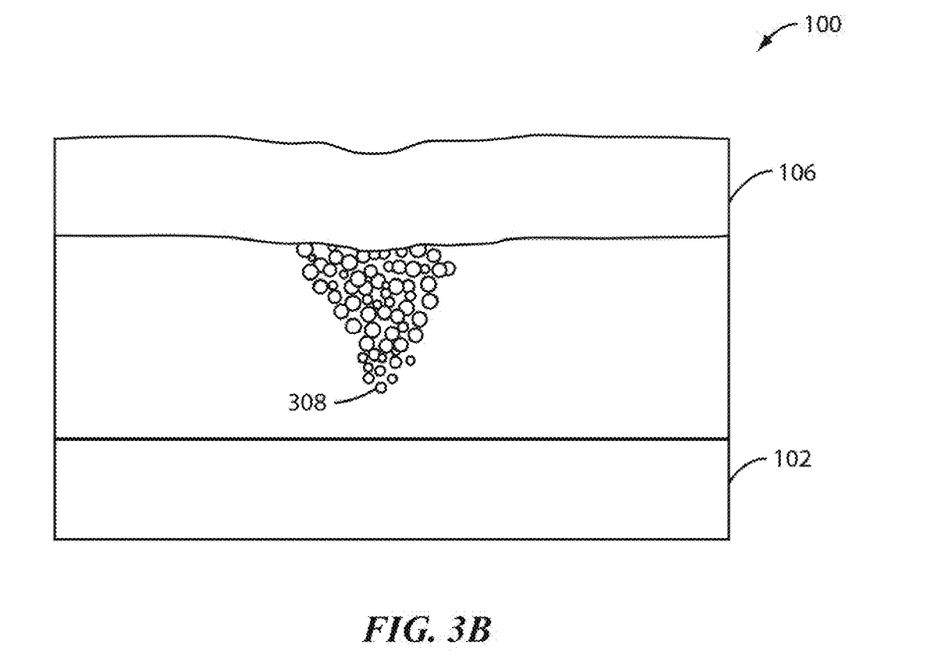
FIG. 3B illustrates a two-terminal device that is placed in an OFF state by applying an erase voltage $V_{eth}$ to the top electrode.

FIGS. 3A and 3B illustrate a switching mechanism of the device 100 during the ON and OFF states according to an embodiment of the present invention. The switching in the a-Si medium 104 is based on formation and retrieval of a conductive filament or a plurality of filaments in a filament region in the a-Si medium 104 according to the program and the erase voltages applied to the electrodes 102 and 106 of the device 100.

FIG. 3A illustrates the device 100 that is placed in the ON state by applying the program voltage $V_{pth}$ to the top electrode 106. The switching medium 104 made of a-Si is provided between the bottom electrode 102 and the top electrode 106. An upper portion of the switching medium 104 includes a metallic region (or conductive path) 302 that extends from the top electrode to about 10 nm above the bottom electrode 102. The metallic region 302 is formed during an electroforming process when a slightly larger voltage than a subsequent switching voltage, e.g., 3~5 V, is applied to the top electrode 106. This large voltage causes the electric field induced diffusion of the metal ions from the top electrode 106 toward the bottom electrode 102, thereby forming a continuous conductive path 303. A lower portion of the switching medium 104 defines a filament region 304 wherein a filament 305 is formed when the program voltage $V_{pth}$ is applied after the electroforming process. The regions 303 and 305 can be also formed together during the electroforming process. The filament 305 comprises a series of metal particles that are trapped in defect sites in a lower portion of the switching medium 104 when the program voltage $V_{pth}$ applied provides sufficient activation energy to push a number of metal ions from the metallic region 302 toward the bottom electrode 102.

The filament 305 is believed to be comprised of a collection of metal particles that are separated from each other by the non-conducting switching medium and does not define a continuous conductive path, unlike the path 303 in the metallic region 302. The filament 305 extends about 2-10 nm depending on implementation. The conduction mechanism in the ON state is electrons tunneling through the metal particles in the filament 305. The device resistance is dominated by the tunneling resistance between a metal particle 306 and the bottom electrode 102. The metal particle 306 is a metal particle in the filament region 304 that is closest to the bottom electrode 102 and is the last metal particle in the filament region 304 in the ON state.

FIG. 3B illustrates device 100 that is placed in an OFF state by applying an erase voltage $V_{eth}$ to the top electrode. The erase voltage exerts sufficient electromagnetic force to dislodge the metal particles trapped in the defects sites of the a-Si and retrieves at least part of the filament from filament region 304. A metal particle 308 that is closest to the bottom electrode in the OFF state is separated from the bottom electrode by a greater distance than the metal particle 306 during the ON state. This increased distance between the metal particle 308 and the bottom electrodes places the device 100 in a high resistance state compared to the ON state. In an embodiment, the resistance ratio between the ON/OFF states ranges from 10E3 to 10E7. Device 100 behaves like a resistor in the ON state and a capacitor in the OFF state (i.e., the switching medium does not conduct current in any meaningful amount and behaves as a dielectric in the OFF state). In an implementation, the resistance is 10E5 Ohm in the ON state and 10E10 Ohm in the OFF state. In another implementation, the resistance is 10E4 Ohm in the ON state and 10E9 Ohm in the OFF state. In yet another implementation, the resistance is at least 10E7 Ohm in the OFF state.

In an embodiment, the device 100 exhibits controllable ON-state current flow of 10 nA-10 mA and endurance of greater 10E6. The device 100, however, exhibits relatively low retention time of 6 years at room temperature. One reason for the low retention time for the device 100 is believed to be the presence of only a small number of metal particles that are trapped in the defect sites in the filament region 304. With a limited number of metal particles in the filament region 304, dislodging only a few metal particles can significantly increase the resistance of the device 100 and cause the device 100 to switch from the ON state to the OFF state. In order to increase the retention time, the device 100 should be provided with a greater number of metal particles in the filament region 304 by increasing the number of defect sites in the filament region 304 to trap the metal particles therein.

The device 100, however, has p-type polysilicon as the bottom electrode 102 and amorphous silicon as the switching medium 104. Since the a-Si switching medium 104 is formed on the polysilicon bottom electrode 102, the amorphous silicon formed thereon is substantially homogenous and have relatively few defect sites at the interface between a-Si and p-type polysilicon. Fewer defect sites at the interface results in fewer metal particles that could be trapped in the filament region 304. Accordingly, even a minor variance in the defect site formation can result in a significant change in percentage of available defect sites needed to trap the metal particles in the filament region 304. This can cause the retention time to fluctuate greatly from a device to a device and from one programmed state to another. Accordingly, it would be desirable to provide the filament region 304 of the switching medium 104 with a higher defect density in order to increase the retention time and make the retention time more predictable. The defect site formation, however, needs to be controllable so that too many defect sites are not created in the filament region which would seriously diminish the endurance of device 400, as explained in U.S. patent application Ser. No. 12/582,086, filed on Oct. 20, 2009, which is incorporated by reference in its entirety.

Figure 4:
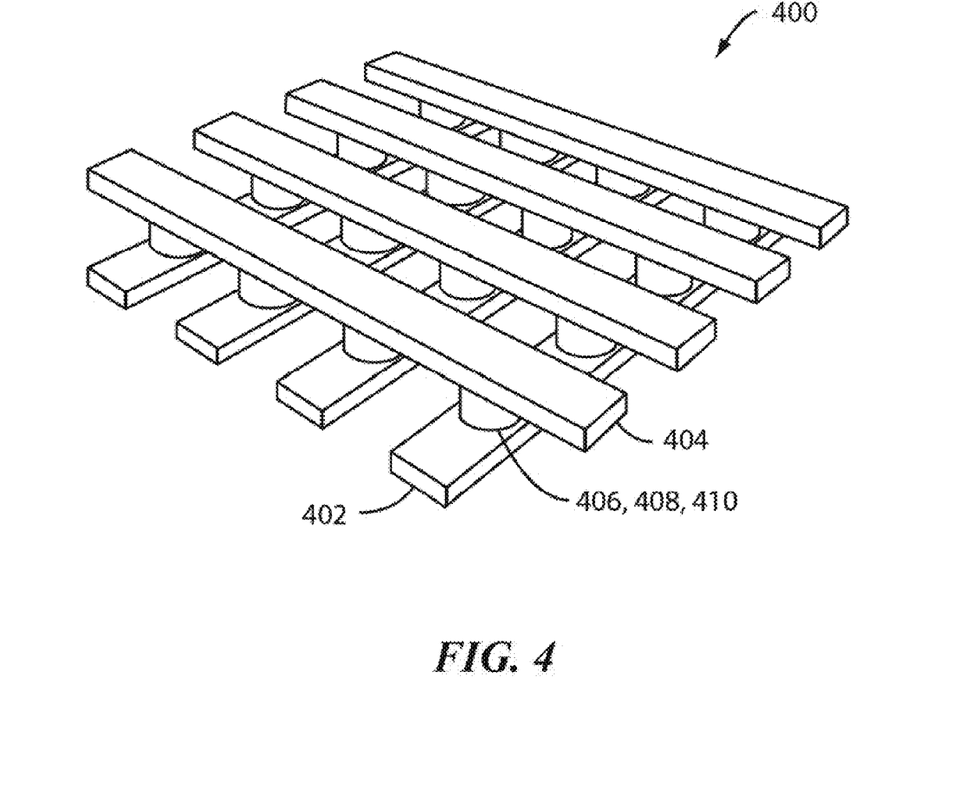
FIG. 4 illustrates a non-crystalline or amorphous silicon (a-Si) based crossbar memory array 400 according to an embodiment of the present invention.

FIG. 4 illustrates a non-crystalline or a-Si based crossbar memory array 400 according to an embodiment of the present invention. The crossbar memory array 400 includes a parallel array of bottom electrodes 402 extending along a first direction. In an embodiment, the bottom electrodes 402 includes a bottom metal (not shown) and a p-type polysilicon (not shown) formed on the bottom metal. The bottom electrodes 402 are nanoscale in the present embodiment. For example, the bottom electrodes 402 have a width of about 40 nm and a pitch of about 60 nm.

A parallel array of top electrodes 404 extends along a second direction to intersect the bottom electrodes 402. The top electrodes 404 include metals capable of supplying filament-forming ions such as silver (Ag), gold (Au), nickel (Ni), aluminum (Al), chromium (Cr), iron (Fe), manganese (Mn), tungsten (W), vanadium (V) and cobalt (Co). In an embodiment, the top electrodes 404 and the bottom electrodes 402 are orthogonal to each other. The top electrodes 404 are nanowires having a width of about 60 nm and a pitch of about 150 nm.

Each intersection 406 of the two arrays defines a two-terminal resistive memory cell 408. The memory cell 408 at each intersection 406 includes two electrodes separated by a switching layer 410. The switching layer or structure can be the same width or narrower than the bottom electrode. In some embodiments, each memory cell in a crossbar memory array can store a single bit. In other embodiments, the memory cells exhibit multi-level resistance thereby allowing storage of a plurality of bits at each cell.

In the present embodiment, the switching layer 410 includes amorphous silicon or other non-crystalline silicon. As used herein, the term "amorphous silicon" refers to silicon material that is in substantially amorphous phase and may include small grains of crystalline silicon. As used herein, the term "non-crystalline silicon" refers to amorphous silicon or amorphous polysilicon that exhibits controllable resistance, a combination thereof, or the like.

The crossbar memory array as described above may be fabricated on a silicon substrate in an embodiment. In another embodiment, III-V type semiconductor compounds (such as gallium arsenide (GaAs), gallium nitride (GaN), boron nitride (BN), etc.) or II-VI type semiconductor compounds (such as cadmium selenide, zinc telluride, etc.) may also be used as the substrate.

Figure 5:
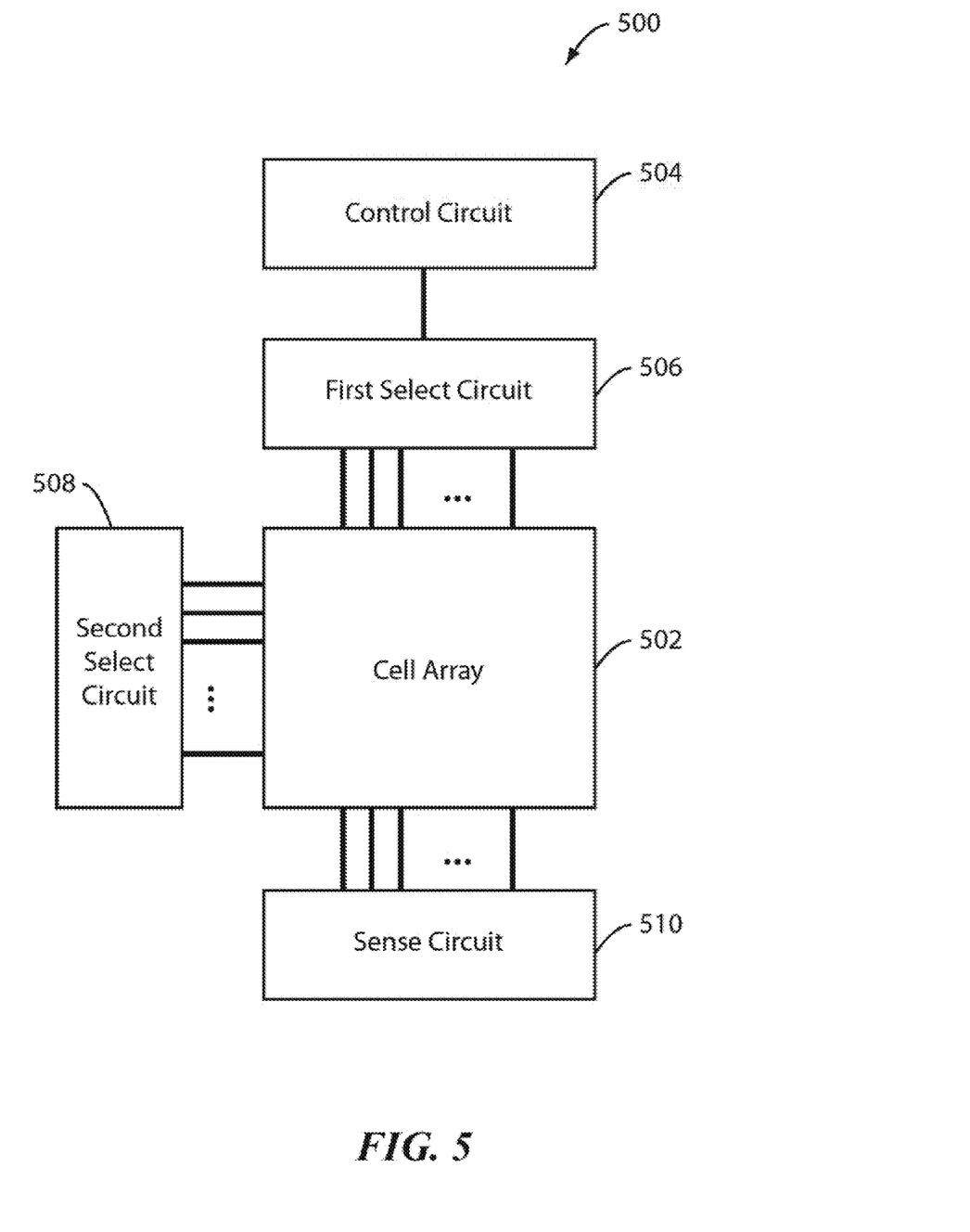
FIG. 5 illustrates a block diagram of a non-volatile memory device including a control circuit and a cell array according to an embodiment of the present invention.

FIG. 5 illustrates a block diagram of a non-volatile solid state resistive device 500 according to an embodiment of the present invention. Device 500 includes a cell array 502 including a plurality of resistive memory cells. The resistive memory cells may be in a NAND, NOR, crossbar, or other configuration. A control circuit 504 provides a program/erase voltage (or current) to the cell array to program or erase the cells in the cell array. A first select circuit 506 is configured to select a row of resistive cells to which a program/erase voltage of control circuit 504 is to be applied. The first select circuit is configured to provide a conductive path to the top electrode of a selected cell so that the program/erase program can be applied thereto. A second select circuit 508 is coupled to the bottom electrodes of the cells in the cell array. The second select circuit is configured to select the column of a selected cell to be programmed or erased and ground the bottom electrode (or the selected column) of the selected cell. Second select circuit 508 applies a voltage corresponding to the program/erase voltage to the bottom electrodes of the non-selected cells so that only the selected cell is programmed or erased. A sense circuit 510 is configured to sense the current or voltage of the selected cell and read out the resistive state of the selected cell. Device 500 may be programmed or erased using different circuit configuration depending on implementation.

Figure 6A:
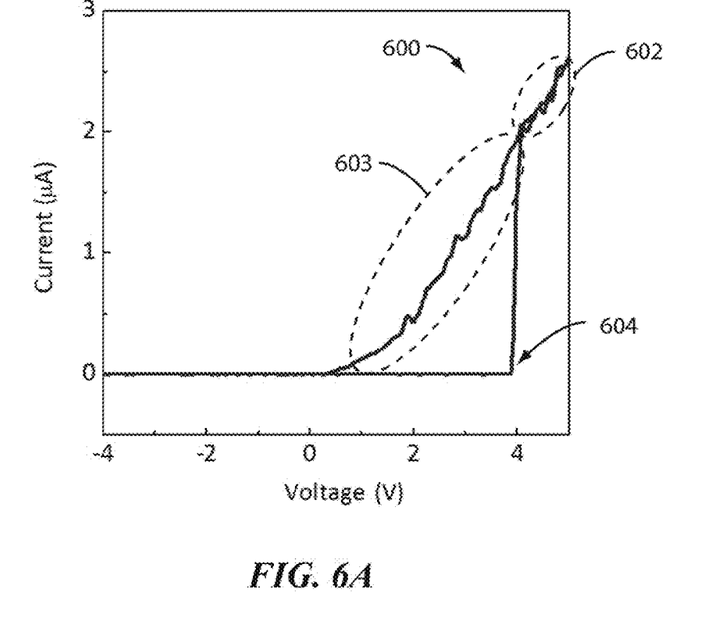
FIG. 6A illustrates a current-voltage curve associated with a program cycle of a non-volatile memory device according to an embodiment of the present invention.

FIG. 6A illustrates a current-voltage curve 600 associated with a program operation of a resistive memory device, e.g., device 100, according to an embodiment of the present invention. Device 100 remains turned OFF until the bias voltage reaches to a program voltage (e.g., 4 volts) at which point (numeral 604) a filament formation process is completed in the switching layer and the device is turned ON. The switching layer is converted from a dielectric to a resistor. Device 100 experiences a current spike at point 604 when it is turned ON (or sudden reduction in voltage dropped across the device if current signal was used to switch the device). The current spikes to I=V/R, or 2 μA in the present embodiment. A person skilled in art would understand that the program voltage and the current amount will vary depending on the device implementation. For example, the program voltage may vary between 1-4 volts depending on implementation.

Once turned ON, device 100 behaves like a resistor in regions 602 and 603. The current increases or decreases linearly with the bias voltage applied. At region 602, device 100 experiences excess Joule heating and excess current density that degrade the device and limit its life cycle. The biasing at region 602 is unnecessary since the device has already been turned ON. The biasing voltage should be stopped as soon as the device has been turned on, preferably at or near point 604. However, it is difficult to time the program operation perfectly since no two devices are uniformly fabricated. Each device has slightly different characteristics. Also even the characteristics of the same device may change over time as it goes through numerous program/erase cycles.

As a result, the program/erase voltage typically is preset with some overdrive voltage to ensure the programming/erasing of the device. The endurance or life cycle of the device can be increased if this overdrive voltage could be limited. In other words, the bias voltage should be turned off at point 604 as soon as a filament is formed in the filament region and the device is turned ON.

In an embodiment, the program operation of device 100 is controlled by using the change in the current flowing through the device instead in assigning a predetermined program voltage (or erase voltage). One approach is to turn off the bias voltage if a rate of the change in current with respect to the change in time is equal to or greater than a predetermined value. Another approach is to turn off the bias voltage if a rate of the change in current with respect to the change in voltage is equal to or greater than a predetermined value. These approaches may be implemented as follows.

In an embodiment, a bias voltage is applied to device 100. Current flowing through the device is measured while the bias voltage is being applied to the device. The bias voltage is increased linearly as a function of time. The measured current is compared with a predetermined value that is determined to be suitable for forming a filament in the switching layer of device 100. If the current reaches the predetermined value, the bias voltage is stopped. Alternatively, the bias voltage may be applied for a little longer to ensure device 100 has been turned ON before cutting off the bias voltage.

In another embodiment, a plurality of voltage pulses (or bias voltage pulses) of increasing magnitude are applied to the device 100. Current flowing in device 100 is measured while the voltage pulses are being applied to device 100. A rate of the change in current is compared with a predetermined value that is determined to be suitable for forming a filament in the switching layer of device 100. The voltage pulses are applied to device 100 until the rate of the change in current is equal to or greater than the predetermined value. A resistance value of device 100 is measured. If the resistance value is lower than a predetermined resistance value, the voltage pulses are stopped or prevented from being applied to the device, and the program operation ends. On the other hand, if the resistance value is greater than the predetermined resistance value, the voltage pulses are applied until the resistance value becomes lower than the predetermined resistance value. Alternatively, one more voltage pulse may be applied after the resistance value has become lower than the predetermined resistance value to ensure that the device has been turned ON.

In yet another embodiment, a predetermined voltage is applied to device 100 for a predetermined period of time. A rate of the change in current in device 100 is measured as a function of time within a predetermined time period. If the rate of the change in current is less than a predetermined value that has been determined to be suitable for forming a filament in the switching layer, the predetermined voltage is continuously applied to device 100. If the rate of the change in current is equal to or greater than the predetermined value, the applying of the predetermined voltage is stopped.

Figure 6B:
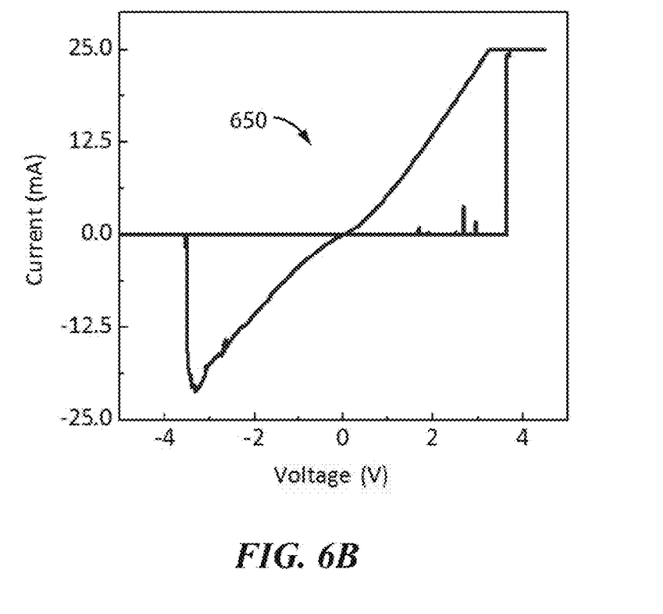
FIG. 6B illustrates a current-voltage curve for program and erase cycles of a non-volatile memory device according to an embodiment of the present invention.

FIG. 6B illustrates a current-voltage curve 650 for program and erase cycles of a non-volatile memory device (e.g., device 100) according to an embodiment of the present invention. Curve 650 illustrates that the erase operation functions substantially the same way as the program operation. The main difference being the use of a negative voltage as an erase voltage to retrieve the filament formed in the filament region of the switching layer of device 100.

Figure 7:
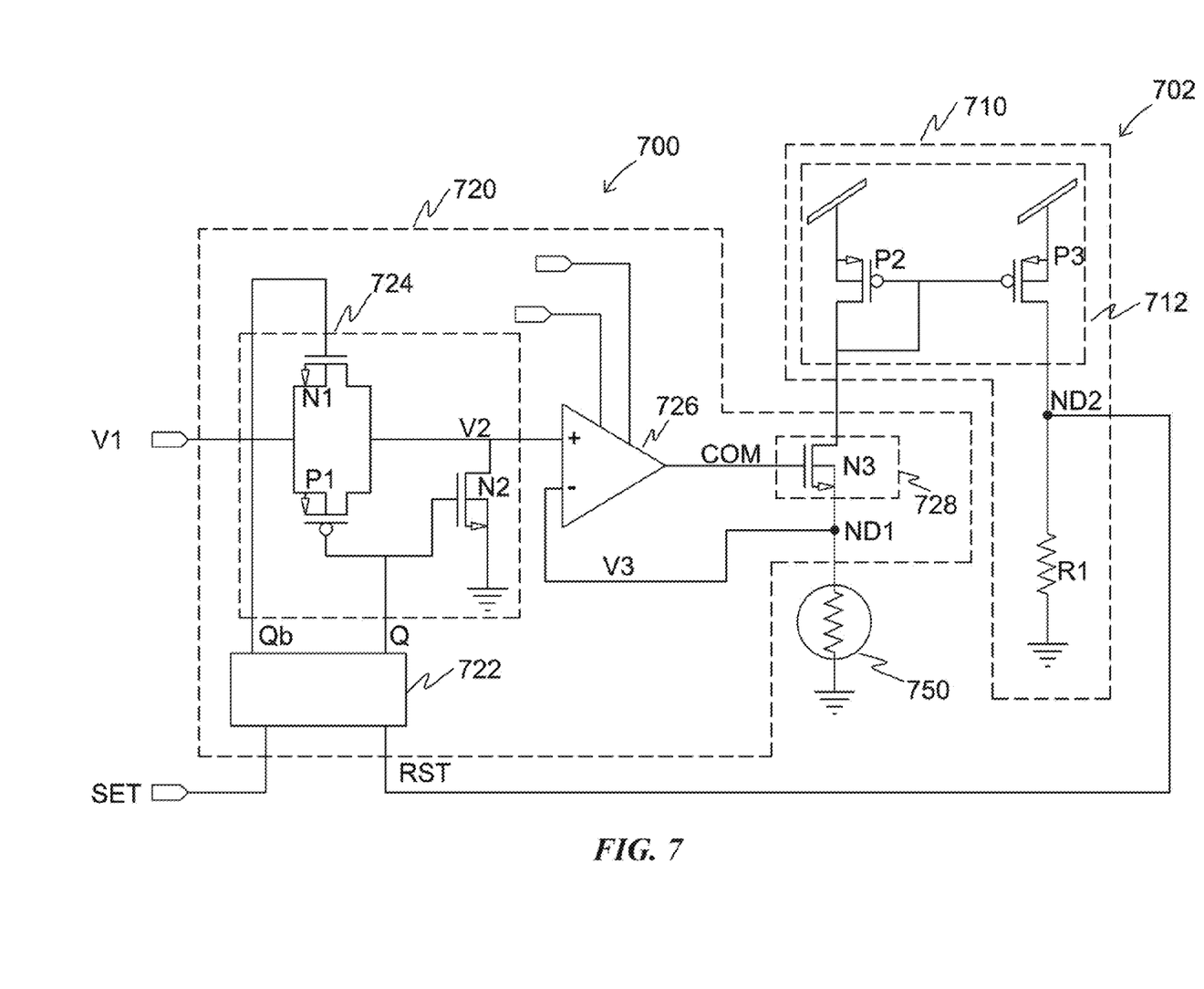
FIG. 7 illustrates a circuit for programming a non-volatile memory device according to an embodiment of the present invention.

FIG. 7 illustrates a non-volatile memory device 700 including a control circuit 702 for programming a resistive memory cell unit 750 according to an embodiment of the present invention. As merely as an illustration, the program operation described herein uses a linearly increasing bias voltage. The voltages pulses or other program methods, however, may also be used.

Resistive memory cell unit 750 includes one or more resistive memory cells. In an embodiment, cell unit 750 is a cell array having a plurality of resistive memory cells. The cells may be in a crossbar array, NAND configuration, NOR configuration, or another configuration. For illustrative convenience, cell unit 750 will be described as a single resistive memory cell. A person skilled in art will understand that control circuit 702 may be implemented with other circuits, e.g., the circuits in FIG. 5, to be used with a cell array having a plurality of cells.

Control circuit 702 includes a current detection unit 710 for detecting current flowing through cell unit 750 and a bias voltage applying unit 720 for applying a bias voltage to cell unit 750 in response to a set signal SET and a reset signal RST according to a result of the current detection.

Bias voltage applying unit 720 includes a control signal generator 722, a voltage transmitter 724, a comparator 726, and a bias voltage applier 728.

Control signal generator 722 is configured to receive the set signal SET to initiate a program operation and the reset signal RST to end the program operation. In an embodiment, control signal generator 722 generates first and second enable signals $Q_b$ and Q in response to the set signal SET and first and second disable signals $Q_b$ and Q in response to the reset signal RST fed back from the current detection unit 710. In an implementation, control signal generator 722 is a flip-flop.

Voltage transmitter 724 outputs a voltage V2 corresponding to an input voltage V1 input thereto. The voltage transmitter includes a transmission gate including a PMOS transistor P1 and an NMOS transistor N1 and a pull-down unit including an NMOS transistor N2. PMOS transistor P1 and NMOS transistor N1 are coupled between a first node for receiving the input voltage V1 and a second node for outputting the voltage V2 according to first and second control signals Qb and Q received from the control signal generator. PMOS transistor P1 and NMOS transistor N1 are turned on when a program operation is initiated to have the voltage V2 mirror the input voltage V1. PMOS transistor P1 and NMOS transistor N1 are turned off to decouple the voltage V2 from the input voltage V1 when the program operation is terminated. NMOS transistor N2 is coupled between the second node and a ground voltage terminal and is configured to receive second disable signal Q through its gate terminal and pull down the voltage V2 to the ground voltage in order to end the program operation.

Comparator 726 receives the voltage V2 on its first input and a bias voltage in its second input and outputs a comparison signal COM. The bias voltage is a voltage applied to the cell unit to program it. In an embodiment, comparator 726 includes a differential amplifier to detect a voltage difference between the two input nodes and amplify the voltage difference. Comparator 726 may include a differential amplifier or an operational amplifier having characteristics of a differential amplifier.

Bias voltage applier 728 supplies the bias voltage to the cell unit in response to the comparison signal COM from comparator 726. In an embodiment, bias voltage applier 728 includes an NMOS transistor N3 coupled between current detection unit 710 and cell unit 750. The gate terminal of NMOS transistor N3 is configured to receive the comparison signal COM.

Current detection unit 710 measures an amount of current flowing through the cell unit during the program operation, and outputs the reset signal RST according to the amount of the current measured. The reset signal RST is enabled when the current measured reaches a program current, i.e., when cell unit 750 is turned ON. In the present embodiment, current detection unit 710 includes a current supplying unit 712 including PMOS transistors P2 and P3, and a resistor R1. The gate terminals of PMOS transistors P2 and P3 of the current supplying unit are commonly coupled to a drain terminal of NMOS transistor N3 of the program voltage applier and the drain terminal of PMOS P2. The source terminals of PMOS transistors P2 and P3 are coupled to a power supply voltage. The drain terminal of PMOS P2 is coupled to the drain terminal of NMOS transistor N3 and also to the gate terminals of PMOS transistors P2 and P3. The drain terminal of PMOS P3 is coupled to a node ND2 for outputting the reset signal RST to control signal generator 722. One end of resistor R1 is coupled to the drain terminal of PMOS transistor P3, i.e., node ND2, and the other end is coupled to the ground. Resistor R1 is provided with the substantially the same resistance as that of cell unit 750 when it is turned ON, so that the current flowing through cell unit 750 is mirrored at node ND2.

Figure 8:
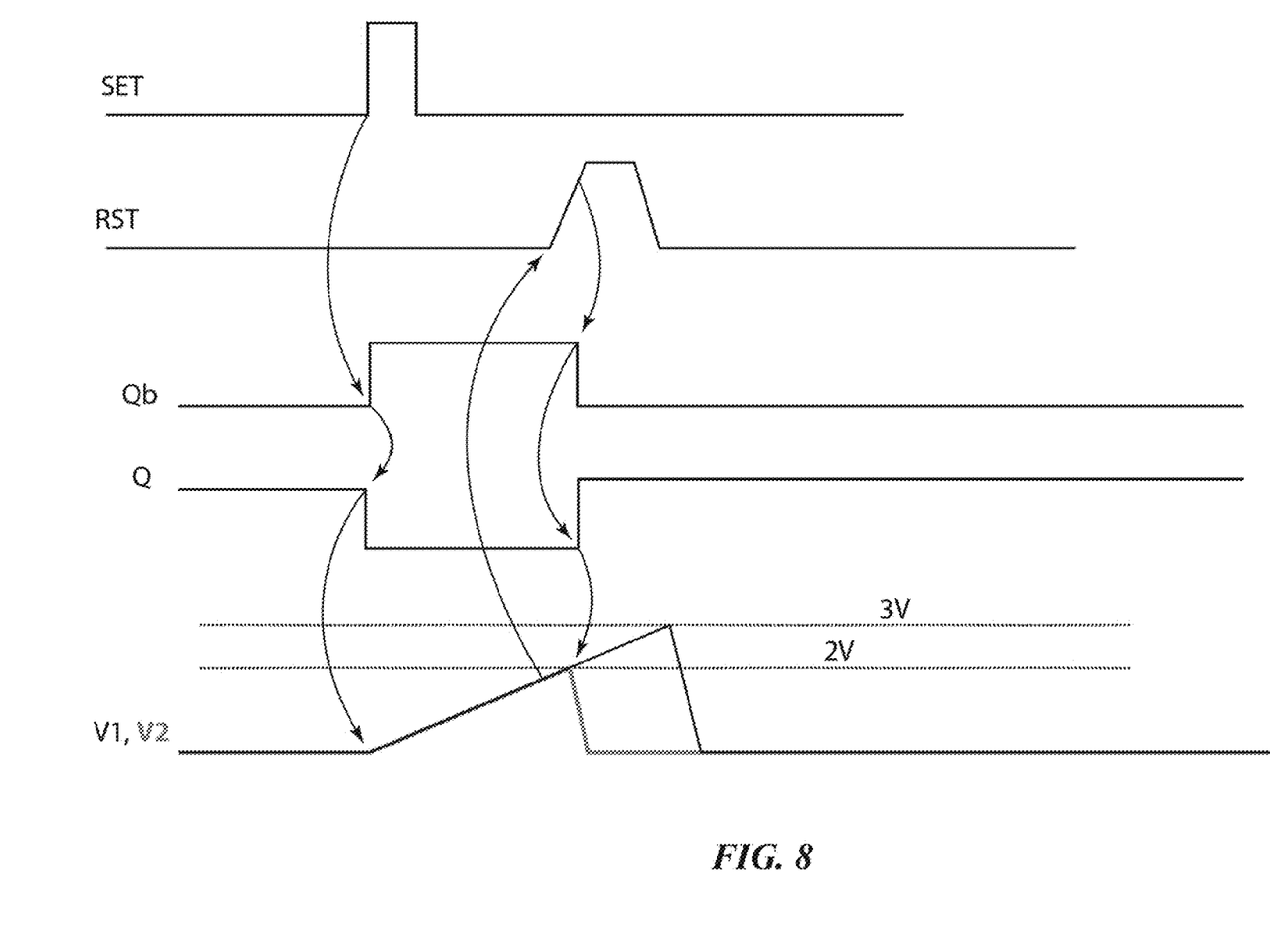
FIG. 8 illustrates a waveform diagram of the circuit in FIG. 7 according to an embodiment of the present invention.

FIG. 8 illustrates a waveform diagram of circuit 702 according to an embodiment of the present invention. The input voltage V1 is set to ramp up to 3V well beyond a program voltage of 2V.

The program operation starts with a set signal SET being inputted to control signal generator 722. The control signal generator outputs enable signals $Q_b$ and Q. Enable signal Qb is logic high and applied to the gate terminal of NMOS transistor N1 to turn it on. Enable signal Q is logic low and applied to the gate terminals of PMOS transistor P1 and NMOS transistor N2. PMOS transistor P1 is turned on and NMOS transistor N2 is turned off.

As the program operation starts, the input voltage V1 is applied to voltage transmitter 724 and is being ramped up, e.g., from 0V to 3V. Enable signals $Q_b$ and Q turn on PMOS transistor P1 and NMOS transistor N1 to provide a conductive path for the input voltage V1. The voltage transmitter outputs a voltage V2 corresponding to the input voltage V1. Since NMOS transistor N2 is turned off by enable signal Q, the output voltage V2 is applied to one of the input nodes of comparator 726.

The output voltage V2 mirrors the voltage ramp up of the input voltage V1. This increasing voltage of the voltage V2 increases its voltage difference with a bias voltage V3 being inputted to the other node of comparator 726. The increasing voltage difference between V2 and V3 causes comparator 726 to output the comparison signal COM of increasing voltage. The comparison signal COM is applied to the gate terminal of NMOS transistor N3 (or program voltage applier 728).

Program voltage applier 728 is turned on to apply a bias voltage to the unit cell (e.g., the top electrode of a selected resistive memory cell). The bias voltage increases with the increasing voltage of the comparison signal COM. That is, the bias voltage mirrors the ramping up of the input voltage V1. Initially, the unit cell remains in a high resistive state and prevents current from flowing through it. Accordingly, no current is detected at the output node ND2. When the bias voltage reaches to 2V, i.e., to the program voltage, the unit cell is converted to a low resistive state (i.e., to a resistor) and allows current to flow through it. A current spike or a large change in current flow (di/dt) is detected at the output node ND2 and applied to control signal generator 722 as a reset signal RST.

Upon receiving the reset signal RST, control signal generator 722 outputs a disable control signal Qb of logic low and a disable control signal Q of logic high to turn off NMOS transistor N1 and PMOS transistor P1. The conductive path previously opened for the input voltage V1 becomes closed. Although the input voltage V1 continues to ramp up to 3 volts, it is does not affect the bias voltage being applied to the unit cell since the conductive path has been closed.

Disable control signal Q also turns on NMOS transistor N2 and the voltage V2 is brought down to a ground voltage. Comparator 726 in turn outputs a comparison signal COM that turns off NMOS transistor N3. The unit cell, therefore, stops receiving current once it has been programmed and experiences very little excess overdrive voltage. Much of the unnecessary excess Joule heating is, therefore, avoided. The unit cell retains the programmed state until it receives an erase voltage. The erase operation functions substantially the same way as the program operation described above. One difference would be a negative biasing voltage would be applied instead of a positive bias voltage.

Although FIG. 8 shows the input voltage V1 and the bias voltage V2 having voltage levels that are increased in a ramp rate as a function of time, the program operation may be performed using voltage pulses that increases as a function of time or other methods.

In accordance with the embodiments of the present invention, since the bias voltage stops shortly after it has reached to a program voltage and the device has been turned ON, (i.e., at or near point 604 in FIG. 6A), device 100 experiences very little excess Joule heating and significantly improves the endurance of the device.

A number of embodiments have been described. Nevertheless, it will be understood that various modifications may be made without departing from the spirit and scope of the invention. For example, the ordering of layers on the substrate could be reversed, where the top electrode is provided below the bottom electrode depending on implementation. Accordingly the terms "top" and "bottom" should not be used to limit the relative positions of the source electrode that provides the filament-forming ions in the a-Si structure and an electrode provided at its opposing side. Accordingly, other embodiments are within the scope of the following claims.

What is claimed is:

1. A method for programming a two terminal resistive memory device, the method comprising:
   applying a bias voltage to a first electrode of a resistive memory cell of the device;
   measuring a current flowing through the cell by detecting a rate of a current change with respect to time; and
   initiating a termination process to stop applying of the bias voltage if the measured current is equal to or greater than a predetermined value.

2. The method of claim 1, wherein the bias voltage is constant.

3. The method of claim 1, wherein detecting the current comprises:
   detecting a rate of a current change with respect to a voltage change.

4. The method of claim 1, wherein the resistive memory device comprises:
   a top electrode;
   a switching element; and
   a bottom electrode.

5. The method of claim 4, wherein the resistive memory device comprises a metal oxide material being a poly crystalline material having grain boundaries and the conductor filament comprising one or more oxygen or metal vacancy sites formed in the grain boundaries.

6. The method of claim 1, wherein the termination process is completed a certain time delay after the termination process has been initiated.

7. The method of claim 1 wherein the bias voltage comprises a linearly increasing voltage with respect to time.

8. The method of claim 1 wherein the bias voltage comprises a series of pulses having increasing voltage with respect to time.

9. The method of claim 1 wherein the bias voltage comprises a predetermined voltage for a predetermined amount of time.

10. A method of forming a conductor filament structure in a switching device, comprising:
    providing a resistive switching device including a top electrode, a switching element, and a bottom electrode;
    applying a predetermined voltage to the device for a predetermined period of time; and
    measuring a rate of change of current in the device as a function of time within the predetermined period of time;
    if the rate of change of current is greater than a predetermined value, initiating a termination process to stop applying the predetermined voltage, and
    if the rate of change of current is less than a predetermined value, continue applying the predetermined voltage,
    wherein the conductor filament structure is being formed in the switching element as the predetermined voltage is being applied to the switching device.

11. The method of claim 10, wherein the termination process is completed a certain time delay after the termination process has been initiated.

12. The method of claim 10, wherein the change of current is measured by measuring a resistance value of the device.

13. The method of claim 10, wherein the termination process is completed a certain time delay after the termination process has been initiated.

14. The method of claim 10 wherein the predetermined voltage is constant with respect to time.

15. The method of claim 10 wherein the predetermined voltage linearly increases with respect to time.

16. The method of claim 10 wherein the predetermined voltage comprises a series of voltage pulses having increasing voltage with respect to time.

17. A method of forming a conductor filament structure in a switching device, comprising:
    providing a resistive switching device including a top electrode, a switching element, and a bottom electrode;
    applying a predetermined current to the device for a predetermined period of time;
    measuring a rate of change of voltage across the device as a function of time within the predetermined period of time;
    if the rate of change of voltage dropped across the device is greater than a predetermined value, initiating a termination process to stop applying the predetermined current, and
    if the rate of change of voltage dropped across the device is less than a predetermined value, continue applying the predetermined current,
    wherein the conductor filament structure is being formed in the switching element as the current is being applied to the switching device.

18. The method of claim 17, wherein the termination process is completed a certain time delay after the termination process has been initiated.

19. The method of claim 17, wherein the current is applied as current pulses and increased as a function of time in a linear manner.

20. The method of claim 17 wherein the current is increased as a function of time in a predefined manner.

21. The method of claim 17 wherein the termination process is completed a certain time delay after the termination process has been initiated.

22. The method of claim 17, wherein the change of voltage is measured by measuring a resistance value of the device.

23. A circuit for programming a two terminal resistive memory device, the circuit comprising:
    means for applying a bias voltage to a first electrode of a resistive memory cell of the device;
    means for measuring a current flowing through the cell by detecting a rate of a current change with respect to time; and means for initiating a termination process to stop applying of the bias voltage if the measured current is equal to or greater than a predetermined value.

24. The circuit of claim 23, wherein the bias voltage is constant.

25. The circuit of claim 23, wherein means for detecting the current comprises:
means for detecting a rate of a current change with respect to a voltage change.

\* \* \* \* \*